(12) United States Patent
Kim et al.

(10) Patent No.: US 7,936,614 B2
(45) Date of Patent: May 3, 2011

(54) SEMICONDUCTOR MEMORY DEVICE AND DRIVING METHOD THEREOF

(75) Inventors: Ki-Ho Kim, Gyeonggi-do (KR); Kang-Seol Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 154 days.

(21) Appl. No.: 12/336,164

(22) Filed: Dec. 16, 2008

(65) Prior Publication Data
US 2010/0061159 A1 Mar. 11, 2010

(30) Foreign Application Priority Data
Sep. 10, 2008 (KR) .................... 10-2008-0089297

(51) Int. Cl.
*G11C 7/06* (2006.01)

(52) U.S. Cl. ............. 365/189.07; 365/226; 365/230.06; 365/189.03; 365/189.17; 365/189.18; 365/189.05; 365/189.09; 365/189.11; 365/227

(58) Field of Classification Search ............. 365/189.07, 365/226, 230.06, 191, 189.03, 189.17, 189.18, 365/189.05, 189.09, 189.11, 227
See application file for complete search history.

(56) References Cited

U.S. PATENT DOCUMENTS
6,765,433 B1 * 7/2004 Kao ............................ 327/544
2006/0039206 A1 * 2/2006 Taniguchi et al. ....... 365/189.05

FOREIGN PATENT DOCUMENTS
| KR | 1019940008257 | * | 4/1994 |
| KR | 1019940008257 A | | 4/1994 |
| KR | 1020050064038 | * | 6/2005 |
| KR | 1020050064038 A | | 6/2005 |

* cited by examiner

*Primary Examiner* — Huan Hoang
*Assistant Examiner* — Fernando N Hidalgo
(74) *Attorney, Agent, or Firm* — IP & T Group LLP (57) ABSTRACT

A semiconductor memory device includes a data input driver and a data output driver for receiving an external power supply voltage, and for inputting and outputting data, respectively; and a voltage detector for detecting the external power supply voltage to generate a detection signal, wherein a drive current of each of the data input driver and the data output driver is controlled by the detection signal.

21 Claims, 11 Drawing Sheets

EXTERNAL POWER SUPPLY VOLTAGE (VDD)

FIG. 4B
(RELATED ART)

EXTERNAL POWER SUPPLY VOLTAGE (VDD)

SEMICONDUCTOR MEMORY DEVICE AND DRIVING METHOD THEREOF

CROSS-REFERENCE TO RELATED APPLICATION

The present invention claims priority of Korean patent application number 10-2008-0089297, filed on Sep. 10, 2008, which is incorporated by reference in its entirety.

BACKGROUND OF THE INVENTION

The present invention relates to a semiconductor design technology, and more particularly, to a semiconductor memory device provided with a data input driver and a data output driver for inputting and outputting data, respectively, and a driving method thereof.

In general, a semiconductor memory device, including Double Data Rate Synchronous RAM (DDR SDRAM), stores or outputs data in accordance with a command required by a Central Processing Unit (CPU). If a write command is provided from the CPU, data from the outside is stored in a memory cell corresponding to an address required by the CPU, and if a read command is provided from the CPU, data stored in a memory cell corresponding to an address required by the CPU is outputted to the outside. That is, in a write operation, input data is applied to a data input driver via a data input/output pad and then fed to a memory cell, and in a read operation, data to be outputted from a semiconductor memory device is first provided to a data output driver and then outputted to the outside via the input/output pad.

Figure 1:
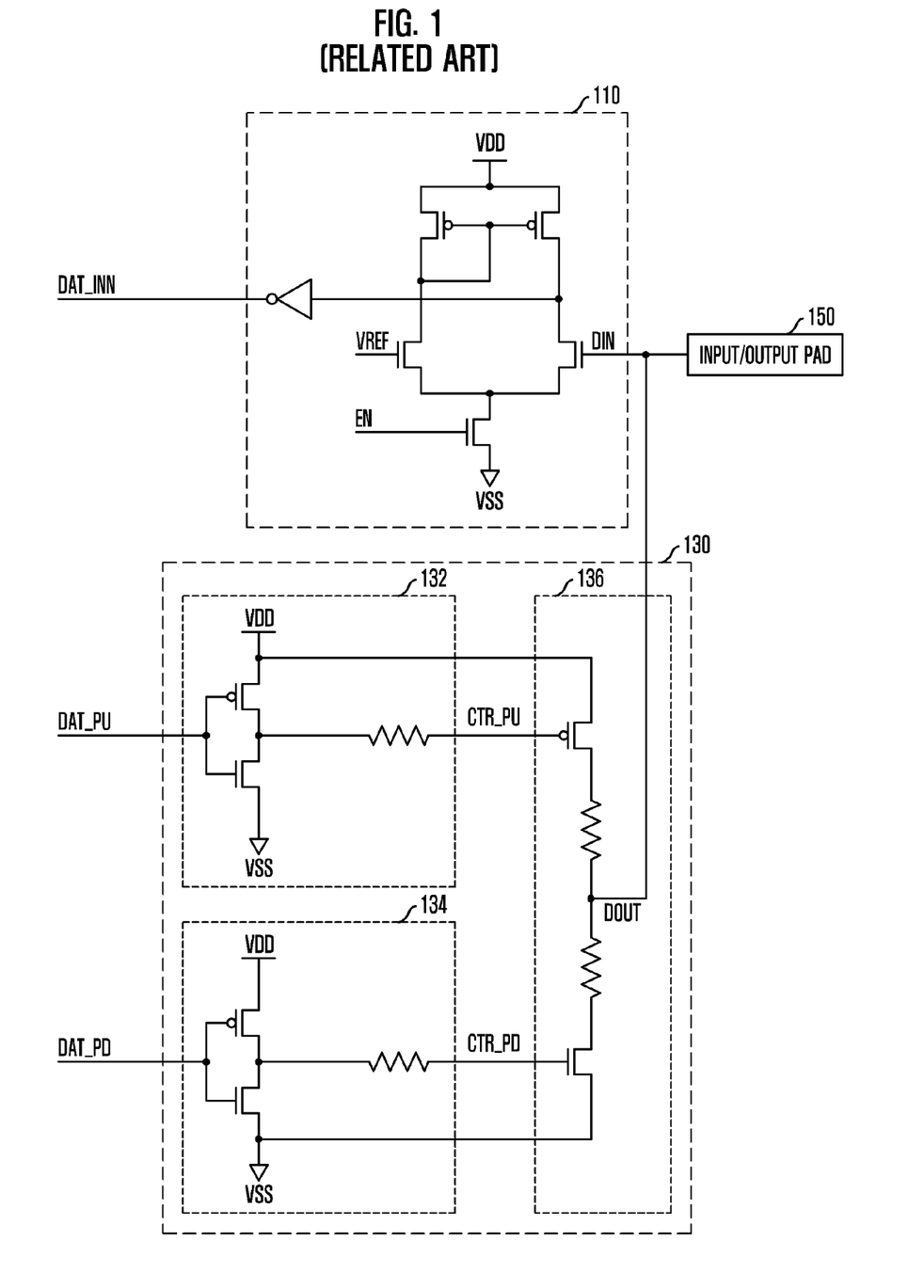
FIG. 1 is a circuit diagram describing a typical data input driver 110 and a data output driver 130.

FIG. 1 is a circuit diagram illustrating a typical data input driver 110 and a data output driver 130.

Referring to FIG. 1, the data input driver 110 compares an input data signal DIN provided via an input/output pad 150 with an external reference signal VREF and buffers the comparison result to output an internal data signal DAT_INN. Here, the external reference signal VREF is a voltage which is provided from the outside and has a ½ voltage level of an external power supply voltage VDD applied to a semiconductor memory device. And, an activation signal EN is used to activate an input operation of the data input driver 110 and is activated during a write operation of the semiconductor memory device.

The data output driver 130 drives an output terminal in response to data signals DAT_PU and DAT_PD to be outputted from the semiconductor memory device, the output terminal denoting a node to which an output data signal DOUT is outputted, and outputs the output data signal DOUT to the outside via the input/output pad 150. The data output driver 130 includes a pull-up pre-drive unit 132, a pull-down pre-drive unit 134, and a main drive unit 136.

The pull-up pre-drive unit 132 generates a pull-up drive control signal CTR_PU in response to a pull-up data signal DAT_PU, and the pull-down pre-drive unit 134 generates a pull-down drive control signal CTR_PD in response to a pull-down data signal DAT_PD. Here, the pull-up data signal DAT_UP and the pull-down data signal DAT_PD indicate data signals synchronized with a clock signal generated from a delay locked loop (not shown) for example.

The main drive unit 136 pull-up or pull-down drives the output terminal in response to the pull-up drive control signal CTR_PU and the pull-down drive control signal CTR_PD. That is, the output data signal DOUT becomes logic 'high' in response to the pull-up drive control signal CTR_PU and becomes logic 'low' in response to the pull-down drive control signal CTR_PD.

Figure 2A:
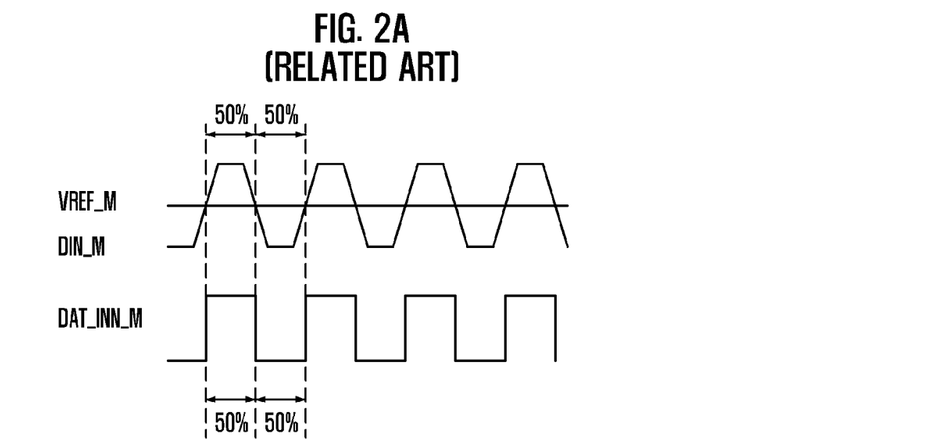
FIGS. 2A, 2B, and 2C are waveform diagrams for explaining the input operation of the data input driver 110 shown in FIG. 1.
Figure 2B:
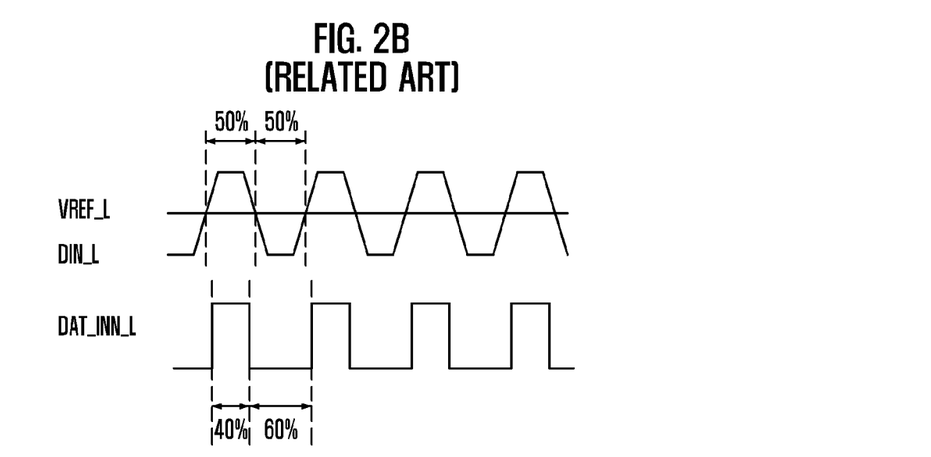
Figure 2C:
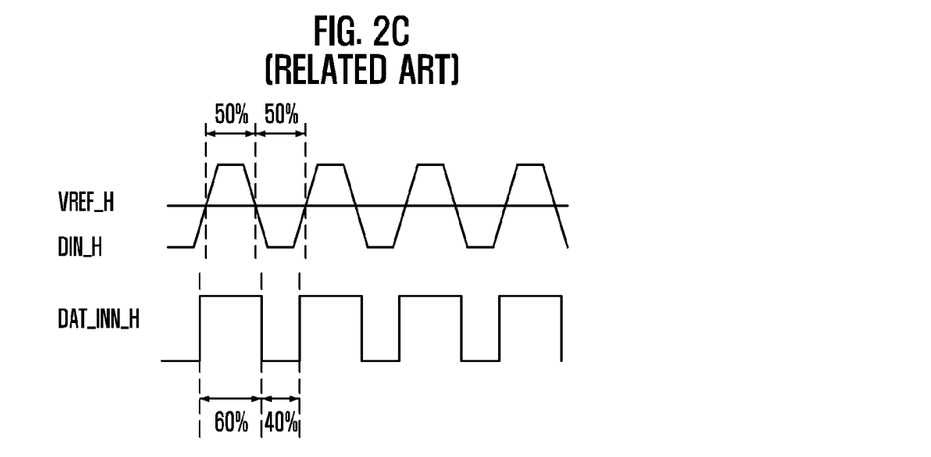

FIGS. 2A, 2B, and 2C are waveform diagrams for explaining the input operation of the data input driver 110 shown in FIG. 1, in which the data input driver 110 has three waveforms as shown depending on a voltage level of an external power supply voltage VDD.

FIG. 2A shows a case where an external power supply voltage VDD has a voltage level (hereinafter, referred to as target voltage level) considered in the initial design. In this case, the external reference voltage VREF, the input data signal DIN, and the internal data signal DAT_INN shown in FIG. 1 will be referred to as VREF_M, DIN_M, and DAT_INN_M, respectively, for convenience of explanation.

Referring to FIGS. 1 and 2A, the data input driver 110 compares the input data signal DIN_M with the external reference signal VREF_M to output the internal data signal DAT_INN_M. Here, the input data signal DIN is inputted with a duty ratio of 50:50 with respect to the external reference voltage VREF. Accordingly, the internal data signal DAT_INN_M is also outputted with a duty ratio of 50:50.

FIG. 2B shows a case where the external power supply voltage VDD is lower than the target voltage level. In this case, the external reference voltage VREF, the input data signal DIN, and the internal data signal DAT_INN in FIG. 1 will be referred to as VREF_L, DIN_L, and DAT_INN_L, respectively, for convenience of explanation.

Referring to FIGS. 1 and 2B, the data input driver 110 compares the input data signal DIN_L with the external reference signal VREF_L to generate the internal data signal DAT_INN_L. At this time, the input data signal DIN_L is inputted with a voltage level between a maximum voltage level and a minimum voltage level preset with respect to the external reference voltage VREF_L. Therefore, it has a duty ratio of 50:50, as in the case of FIG. 2A.

However, since a voltage level of the external power supply voltage VDD is lower than the target voltage level to reduce a drive current of the data input driver 110, the internal data signal DAT_INN_L in FIG. 2B does not maintain a duty ratio of 50:50.

FIG. 2C represents a case where the external power supply voltage VDD is higher than the target voltage level. In this case, the external reference voltage VREF, the input data signal DIN, and the internal data signal DAT_INN in FIG. 1 will be referred to as VREF_H, DIN_H, and DAT_INN_H, respectively, for convenience of explanation.

Referring to FIGS. 1 and 2C, the data input driver 110 has an increased drive current by a higher voltage level of the external power supply voltage VDD. Therefore, the internal data signal DAT_INN_H does not maintain a duty ratio of 50:50, as in the case of FIG. 2B.

That is to say, in the cases of FIGS. 2B and 2C, the duty ratio of the internal data signal becomes not constant depending on a voltage level of the external power supply voltage VDD. This inconstant duty ratio results in a reduction in reliability of the internal data signal.

Figure 3:
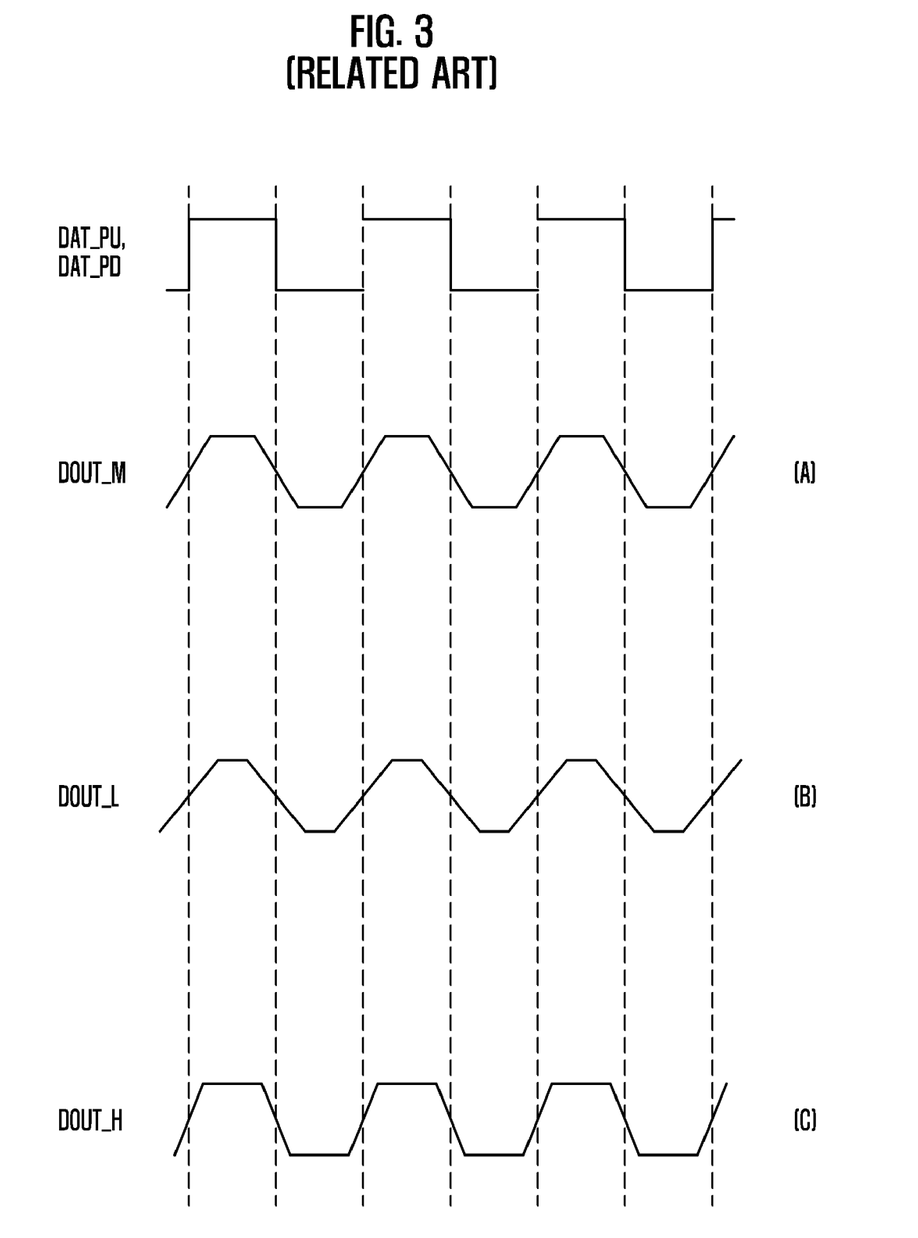
FIG. 3 shows waveforms for explaining the output operation of the data output driver 130 shown in FIG. 1.

FIG. 3 shows waveforms for explaining the output operation of the data output driver 130 shown in FIG. 1.

As described in FIG. 1, the data output driver 130 is constituted by the pull-up and the pull-down pre-drive units 132 and 134, and the main drive unit 136. The pull-up and the pull-down pre-drive units 132 and 134 determine a time point the main drive unit 136 becomes on or off and also determine a slew rate of the output data signal DOUT to be outputted from the main drive unit 136 based on the determined time point.

Next, a PMOS transistor provided in the main drive unit 136 is turned on by an NMOS transistor provided in the pull-up pre-drive unit 132 and an NMOS transistor provided in the main drive unit 136 is turned on by a PMOS transistor provided in the pull-down pre-drive unit 134. Because of this, the NMOS transistor in the pull-up pre-drive unit 132 and the PMOS transistor in the pull-down pre-drive unit 134 should be designed in an appropriate size, especially by considering the slew rate.

Shown in (A), (B) and (C) of FIG. 3 are a pull-up data signal DAT_PU, a pull-down data signal DAT_PD, an output data signal DOUT_M in case of (A) of FIG. 3 where the external power supply voltage VDD has the target voltage level, an output data signal DOUT_L in case of (B) of FIG. 3 where the external power supply voltage VDD is lower than the target voltage level, and an output data signal DOUT_H in case of (C) of FIG. 3 where the external power supply voltage VDD is higher than the target voltage level.

As can be seen from the drawings, in case of (B) of FIG. 3, the external power supply voltage VDD has a lower voltage level, so that the pull-up and the pull-down pre-drive units 132 and 134 make the on/off time point of the main drive unit 136 slower. Thus, the slew rate of the output data signal DOUT_L becomes smaller. That is, a slope of the output data signal DOUT_L becomes smaller than DOUT_M in (A) of FIG. 3.

On the contrary, in case of (C) of FIG. 3, the external power supply voltage VDD has a higher voltage level, so that the on/off time point of the main drive unit 136 becomes faster. Thus, the slew rate of the output data signal DOUT_H becomes greater. That is, a slope of the output data signal DOUT_H becomes greater than DOUT_M in (A) of FIG. 3.

That is, in cases of (B) and (C) of FIG. 3, the slew rate of the output data signal varies depending on a voltage level of the external power supply voltage VDD. In general, since the slew rate of the output data signal is related to data reliability and power consumption, it is preferably designed in a manner that the slew rate should properly be maintained based on the data reliability and power consumption. However, the cases illustrated in (B) and (C) of FIG. 3 do not maintain the slew rate.

Figure 4A:
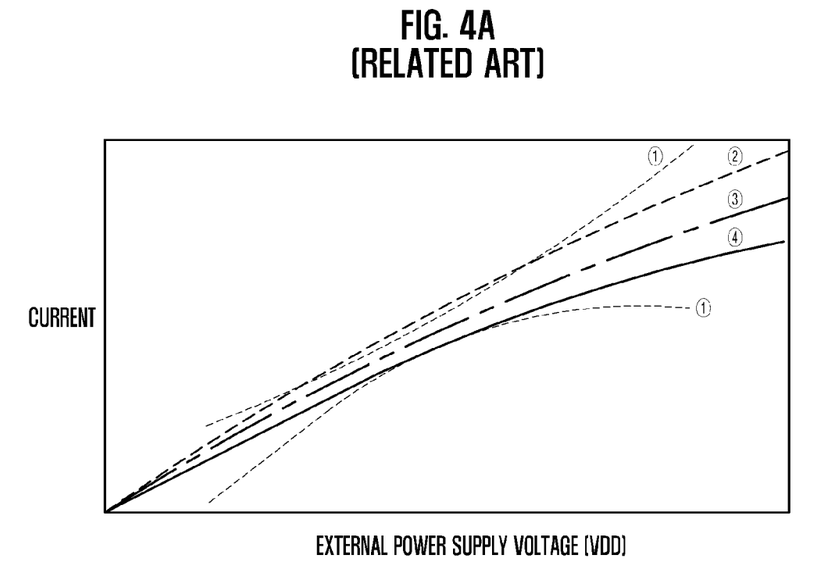
FIGS. 4A and 4B are graphs describing current characteristics in terms of the external power supply VDD of the main drive unit 130 in FIG. 1.
Figure 4B:
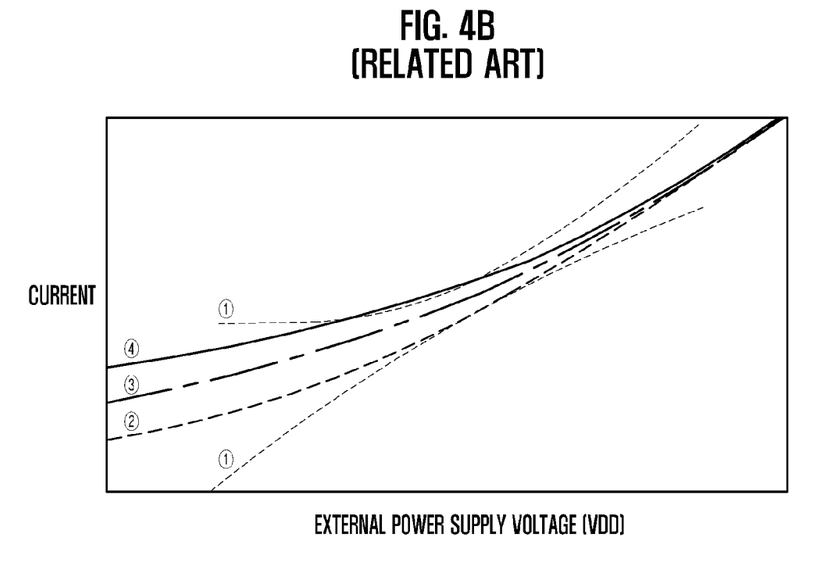

FIGS. 4A and 4B are views for explaining current characteristics in terms of the external power supply VDD of the main drive unit 130 in FIG. 1. That is, FIG. 4A represents characteristics of current being consumed by the main drive unit 130 during the pull-down operation and FIG. 4B represents characteristics of current being consumed by the main drive unit 130 during the pull-up operation. In each of the FIGS. 4A and 4B, two characteristic lines ① indicate the lower limit and the upper limit of current being consumed, which are defined as specification, respectively. A characteristic line ② denotes a case where the external power supply voltage VDD is higher than the target voltage level, and a characteristic line ③ denotes a case where the external power supply voltage VDD has the target voltage level. A characteristic line ④ represents a case where the external power supply voltage VDD is lower than the target voltage level.

As can be seen from FIGS. 4A and 4B, the current being consumed does not meet the specification as the voltage level of the external power supply varies.

As described above, the typical data input driver 110 and the data output driver 130 have different operational characteristics depending on a voltage level of the external power supply voltage VDD. This cannot ensure sufficient reliability in data exchange operations between the data input driver 110 and the CPU and between the data output driver 130 and the CPU.

Moreover, since the current being consumed exists outside of the range defined in the spec, mass-production and compatibility of products can be decreased. That is, if the products manufactured do not meet the spec, they are dealt with as being defective, thus lowering the efficiency of mass-production. For example, suppose that there are environments where an external supply voltage VDD of 1 V is used and an external supply voltage VDD of 1.5 V is used. In this case, if one of them does not meet the spec, compatibility may be reduced.

SUMMARY OF THE INVENTION

An embodiment of the present invention is directed to providing a semiconductor memory device capable of controlling drive currents of input and output circuits depending on a voltage level of external power supply voltage.

Another embodiment of the present invention is directed to providing a semiconductor memory device capable of ensuring that data being input to or output from the input and output circuits can reliably have the same operational characteristics regardless of the external power supply voltage.

In accordance with an aspect of the present invention, there is provided a semiconductor memory device, which includes: a data input driver and a data output driver for receiving an external power supply voltage, and for inputting and outputting data, respectively; and a voltage detector for detecting the external power supply voltage to generate a detection signal, wherein a drive current of each of the data input driver and the data output driver is controlled by the detection signal.

In accordance with an aspect of the present invention, there is provided a read drive circuit for use in a semiconductor memory device, the read drive circuit including: a pre-drive unit for generating a drive control signal corresponding to internal data; a main drive unit for providing output data corresponding to the internal data to its output terminal in response to the drive control signal; and a voltage detector for detecting an external power supply voltage to generate a detection signal to control a drive current of each of the pre-drive unit and the main drive unit.

In accordance with an aspect of the present invention, there is provided a driving method of a semiconductor memory device, including: detecting a voltage level of an external power supply voltage; if the external power supply voltage is higher than a target voltage level based on the detection result, performing input/output operations of data with a less drive current than a drive current corresponding to the external power supply voltage; and if the external power supply voltage is lower than the target voltage level based on the detection result, performing input/output operations of data with a more drive current than a drive current corresponding to the external power supply voltage.

The present invention detects a voltage level of an external power supply voltage and controls drive currents of input and output circuits in a semiconductor memory device based on the detected voltage level, so that the input and output circuits can always have the same operational characteristics.

DESCRIPTION OF SPECIFIC EMBODIMENTS

Hereinafter, preferred embodiments of the present invention will be described in detail with reference to the accompanying drawings so that the invention can readily be practiced by those skilled in the art.

Figure 5:
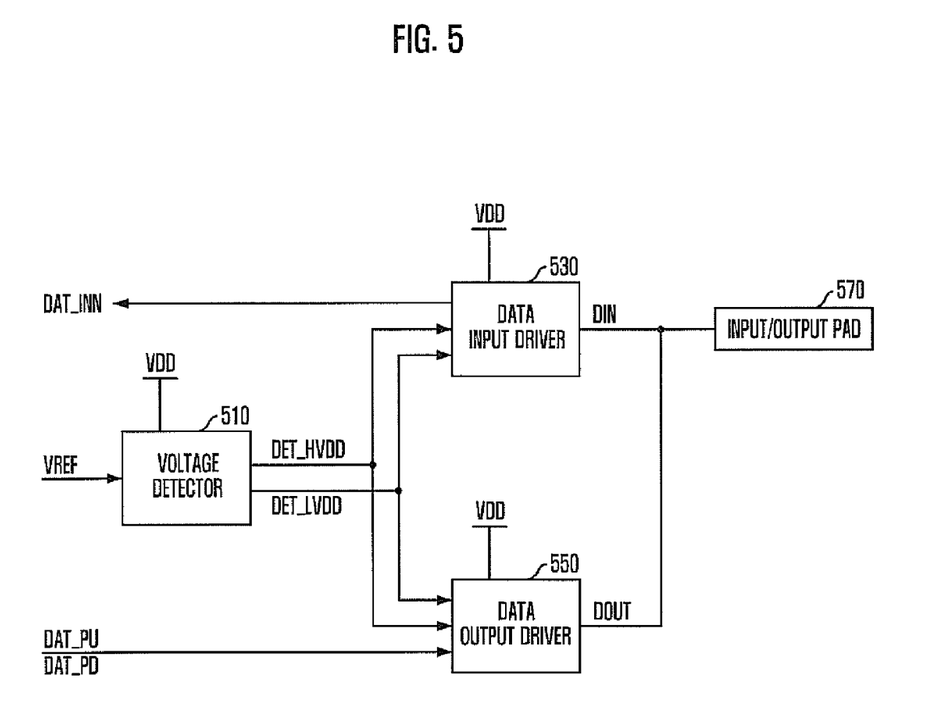
FIG. 5 is a block diagram illustrating a partial configuration for explaining a semiconductor memory device in accordance with an embodiment of the present invention.

FIG. 5 is a block diagram illustrating a partial configuration for explaining a semiconductor memory device in accordance with an embodiment of the present invention.

Referring to FIG. 5, the semiconductor memory device includes a voltage detector 510, a data input driver 530, a data output driver 550, and an input/output pad 570.

The voltage detector 510 serves to detect a voltage level of an external power supply voltage VDD to generate first and second detection signals DET_HVDD and DET_LVDD in response to the external power supply voltage VDD and an external reference voltage VREF. The external reference voltage VREF is a voltage which is provided from the outside and has, for example, a ½ level of the external power supply voltage VDD applied to the semiconductor memory device.

The data input driver 530 receives an input data signal DIN from the input/output pad 570 to generate an internal data signal DAT_INN, and the data output driver 550 takes data signals DAT_PU and DAT_PD to be outputted to generate an output data signal DOUT for outputting to the input/output pad 570.

Here, the data input driver 530 and the data output driver 550 receive the external power supply voltage VDD, and a drive current of the data input driver 530 and a drive current of the data output driver 550 can be controlled in response to the first and the second detection signals DET_HVDD and DET_LVDD to be described later.

Figure 6:
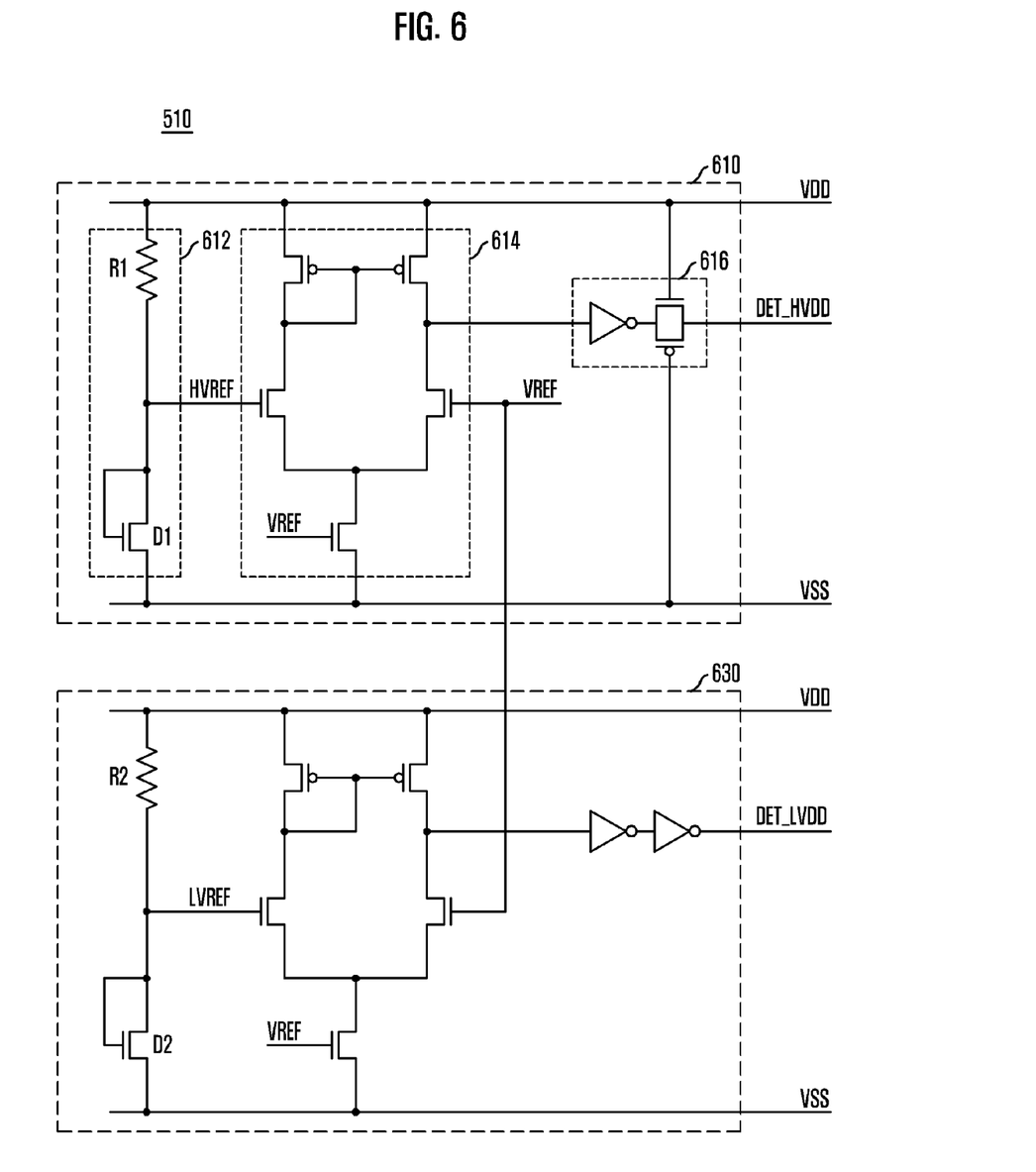
FIG. 6 is a detailed circuit diagram illustrating the voltage detector 510 shown in FIG. 5.

FIG. 6 is a detailed circuit diagram illustrating the voltage detector 510 shown in FIG. 5.

Referring to FIG. 6, the voltage detector 510 includes first and second detection signal generators 610 and 630 for generating first and second detection signals DET_HVDD and DET_LVDD, respectively.

The first detection signal generator 610 is for detecting a voltage level of the external power supply voltage VDD to produce the first detection signal DET_HVDD, and is provided with a voltage divider 612, a voltage comparator 614, and a detection signal output portion 616.

The voltage divider 612 is for dividing the external power supply voltage VDD to create a first reference voltage HVREF with a predetermined voltage level, and is provided with a first resistor R1 and a first diode D1 coupled between the external power supply voltage VDD terminal and a ground voltage VSS terminal. The predetermined voltage level of the first reference voltage HVREF may be changed based on the sizes of the first resistor R1 and the first diode D1 that are designed, as will be described later.

The voltage comparator 614 compares the first reference voltage HVREF with the external reference voltage VREF to output a comparison result. If the first reference voltage HVREF is higher than the external reference voltage VREF, the voltage comparator 614 outputs the comparison result as logic 'high', and if the first reference voltage HVREF is lower than the external reference voltage VREF, it outputs the comparison result as logic 'low'.

The detection signal output portion 616 outputs the comparison result of the voltage comparator 614 as the first detection signal DET_HVDD. A transfer gate provided in the detection signal output portion 616 functions to synchronize the output time of the second detection signal DET_LVDD generated from the second detection signal generator 630 with that of the first detection signal DET_HVDD.

Meanwhile, the second detection signal generator 630 has a similar configuration to the first detection signal generator 610, and therefore, a detailed description thereof will be omitted here. However, it is preferably designed in a way that the first resistor R1 and the first diode D1 in the first detection signal generator 610 have different sizes from a second resistor R2 and a second diode D2 in the second detection signal generator 630. That is, the first reference voltage HVREF generated from the first detection signal generator 610 and the second reference voltage LVREF from the second detection signal generator 630 should have predetermined voltage levels in response to the external power supply voltage VDD. In the embodiment, it is preferably designed that the first reference voltage HVREF can have a higher voltage level than the second reference voltage LVREF.

Figure 7:
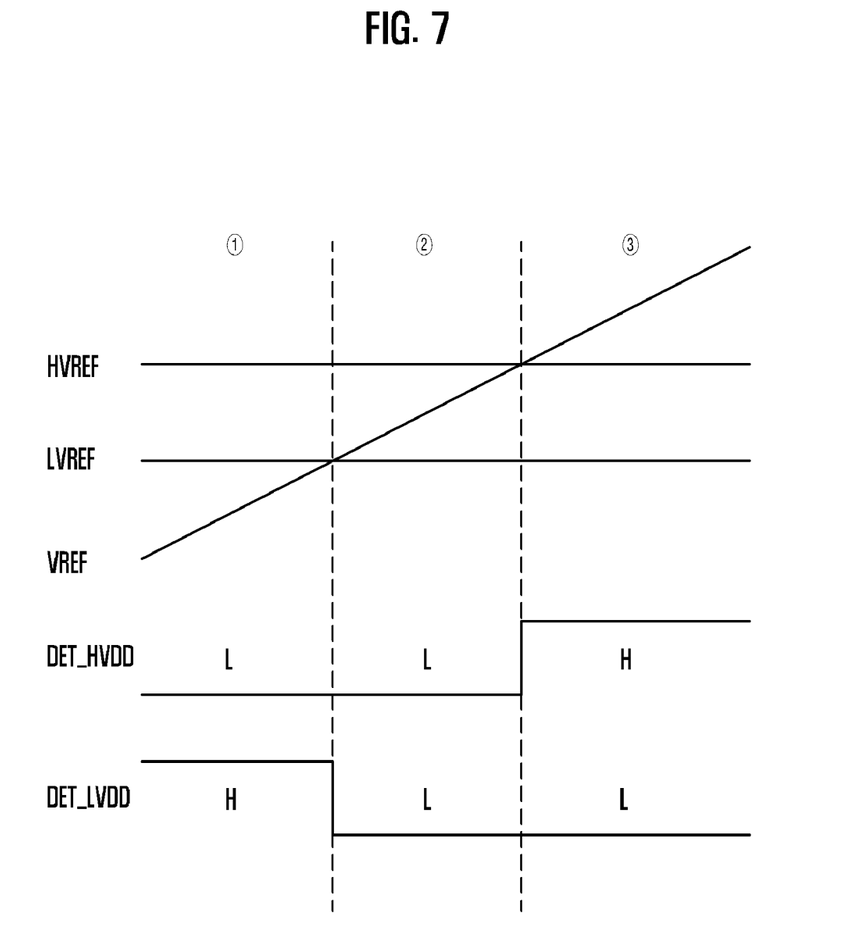
FIG. 7 is a waveform diagram for explaining the operation of the voltage detector 510 shown in FIG. 6.

FIG. 7 is a waveform diagram for explaining the operation of the voltage detector 510 in FIG. 6, which shows the external reference voltage VREF, the first and the second reference voltages HVREF and LVREF, and first and second detection signals DET_HVDD and DET_LVDD. Here, the external reference voltage VREF may have a ½ level of the external power supply voltage VDD, as noted above.

As shown in FIG. 7, the relationship between the external reference voltage VREF and the first and the second reference voltages HVREF and LVREF may be explained by dividing them into three cases of intervals, as follows.

The first interval ① is an interval when the voltage level of the external reference voltage VREF is lower than the voltage levels of the first and the second reference voltages HVREF and LVREF, and the second interval ② is an interval when the voltage level of the external reference voltage VREF is lower than the voltage level of the first reference voltage HVREF but higher than the voltage level of the second reference voltage and LVREF. The third interval ③ is an interval when the voltage level of the external reference voltage VREF is higher than the voltage levels of the first and the second reference voltages HVREF and LVREF. For reference, the target voltage level defined in the specification may correspond to an interval between the first and the second reference voltages HVREF and LVREF.

In case of the first interval ①, the first detection signal DET_HVDD becomes logic 'low', and the second detection signal DET_LVDD becomes logic 'high'. In case of the second interval ②, both the first detection signal DET_HVDD and the second detection signal DET_LVDD become logic 'low'. And in case of the third interval ③, the first detection signal DET_HVDD becomes logic 'high', and the second detection signal DET_LVDD becomes logic 'low'.

Figure 8:
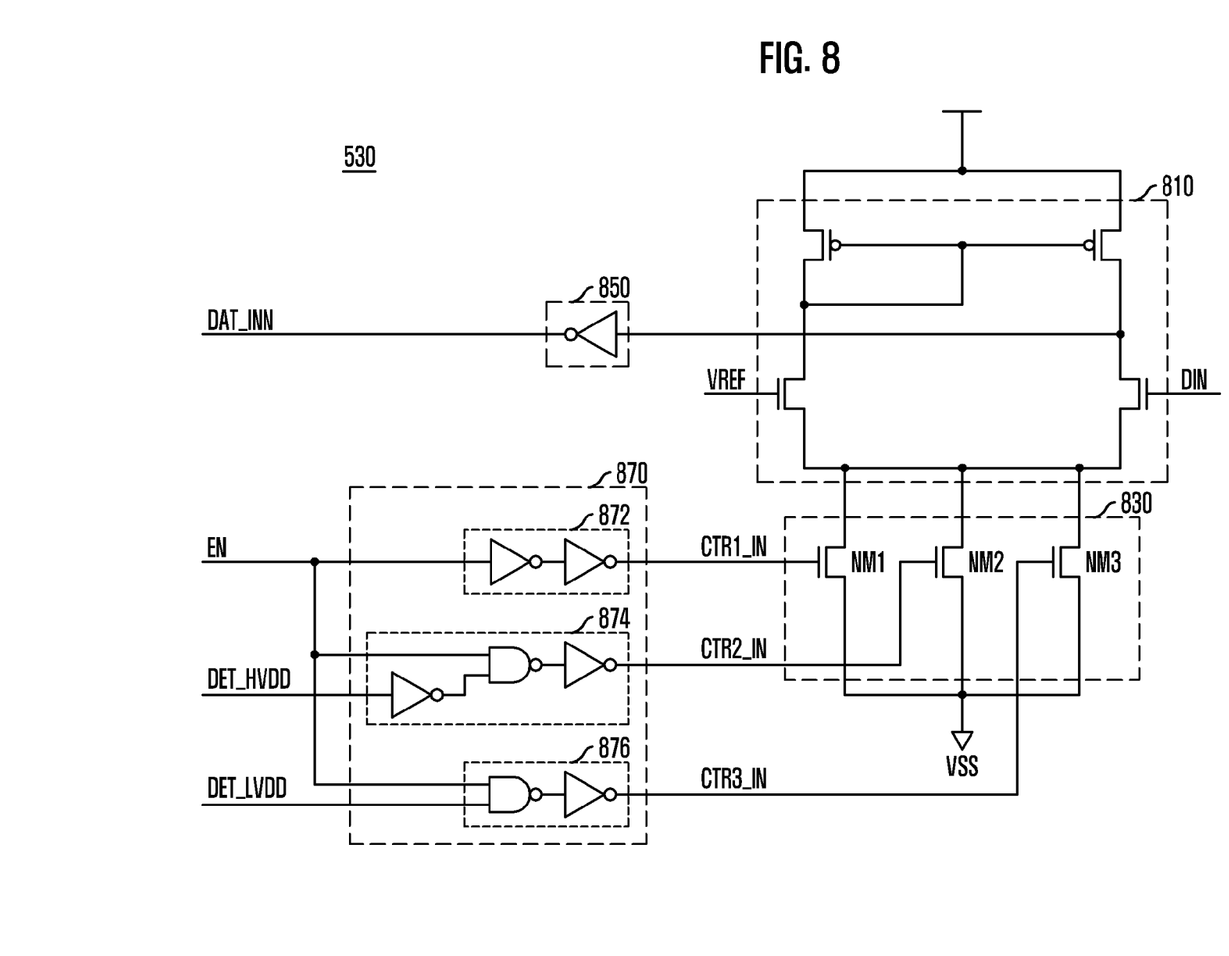
FIG. 8 is a detailed circuit diagram illustrating the data input driver 530 shown in FIG. 5.

FIG. 8 is a detailed circuit diagram illustrating the data input driver 530 shown in FIG. 5.

Referring to FIG. 8, the data input driver 530 is provided with an input portion 810, an input drive current controller 830, a buffering portion 850, and an input control signal generator 870.

The input portion 810 is for receiving an input data signal DIN and comparing the external reference voltage VREF with the input data signal DIN to generate the comparison result. For example, if the voltage level of the input data signal DIN is higher than the external reference voltage VREF, the input portion 810 outputs a voltage level corresponding to logic 'low', and if the voltage level of the input data signal DIN is lower than the external reference voltage VREF, it outputs a voltage level corresponding to logic 'high'.

The input drive current controller 830 serves to control a drive current of the input portion 810 in response to first to third input control signals CTR1_IN, CTR2_IN, and CTR3_IN, and is provided with first to third NMOS transistors NM1, NM2, and NM3 which have a source-drain path established between the input portion 810 and the ground voltage VSS terminal and receive the first to third input control signals CTR1_IN, CTR2_IN, and CTR3_IN, respectively.

The buffering portion 850 is for buffering an output signal of the input portion 810 to generate an internal data signal DAT_INN.

The input control signal generator 870 serves to generate the first to third input control signals CTR1_IN, CTR2_IN, and CTR3_IN in response to the first and the second detection signals DET_HVDD and DET_LVDD, and is provided with first to third input control signal generators 872, 874, and 876.

The first input control signal generator 872 generates the first input control signal CTR1_IN in response to an activation signal EN. Here, the activation signal EN is used to activate the input operation of data to the input portion. For instance, the activation signal is a signal which is activated upon a write operation of a semiconductor memory device. The second input control signal generator 874 generates the second input control signal CTR2_IN in response to the activation signal EN and the first detection signal DET_HVDD, and the third input control signal generator 876 generates the third input control signal CTR3_IN in response to the activation signal EN and the second detection signal DET_LVDD.

First, the operation of the input control signal generator 870 will simply be described. When the activation signal EN is activated, the first input control signal CTR1_IN is activated, and when the first detection signal DET_HVDD is activated, the second input control signal CTR2_IN is activated in response to the activation signal EN. And when the second detection signal DET_LVDD is activated, the third input control signal CTR3_IN is activated in response to the activation signal EN. That is to say, the input control signal generator 870 can activate the first to third input control signals CTR1_IN, CTR2_IN, and CTR3_IN in the interval when the input portion 810 is activated.

Referring again to FIGS. 7 and 8, in case of the first interval ①, the first to third input control signals CTR1_IN, CTR2_IN, and CTR3_IN are all activated, so that first to third NMOS transistors NM1, NM2, and NM3 can all be turned on. In other words, in a case where a semiconductor memory device uses a relatively low external power supply voltage VDD, that is, in a case where the semiconductor memory device receives a lower external power supply voltage VDD than a target voltage level, the data input driver 530 can have a drive current corresponding to the first to third NMOS transistors NM1, NM2, and NM3.

In case of the second interval ②, the first and the second input control signals CTR1_IN and CTR2_IN are activated and the third input control signal CTR3_IN is inactivated, so that first and the second NMOS transistors NM1 and NM2 can be turned on. That is, in a case where the semiconductor memory device receives an external power supply voltage VDD equivalent to the target voltage level, the data input driver 530 can have a drive current corresponding to the first and the second NMOS transistors NM1 and NM2.

In case of the third interval ③, only the first input control signal CTR1_IN is activated and the second and the third input control signals CTR2_IN and CTR3_IN are inactivated, so that only the first NMOS transistor NM1 can be turned on. In other words, in a case where the semiconductor memory device receives a higher external power supply voltage VDD than the target voltage level, the data input driver 530 can have a drive current corresponding to the first NMOS transistor NM1.

Since the data input driver 530 of the present invention can control a drive current depending on a voltage level of the external power supply voltage VDD, the internal data signal DAT_INN can always have the same characteristics. That is, typically, the cases as shown in FIGS. 2A, 2B, and 2C occurred depending on a change in a voltage level of the external power supply voltage VDD. However, in the present invention, since the drive current of the data input driver 530 is controlled by the external power supply voltage VDD, although the voltage level of the external power supply voltage VDD is changed as in the cases of FIGS. 2B and 2C, the internal data signal DAT_INN can always have a duty ratio of 50:50 as in the case of FIG. 2A.

Figure 9:
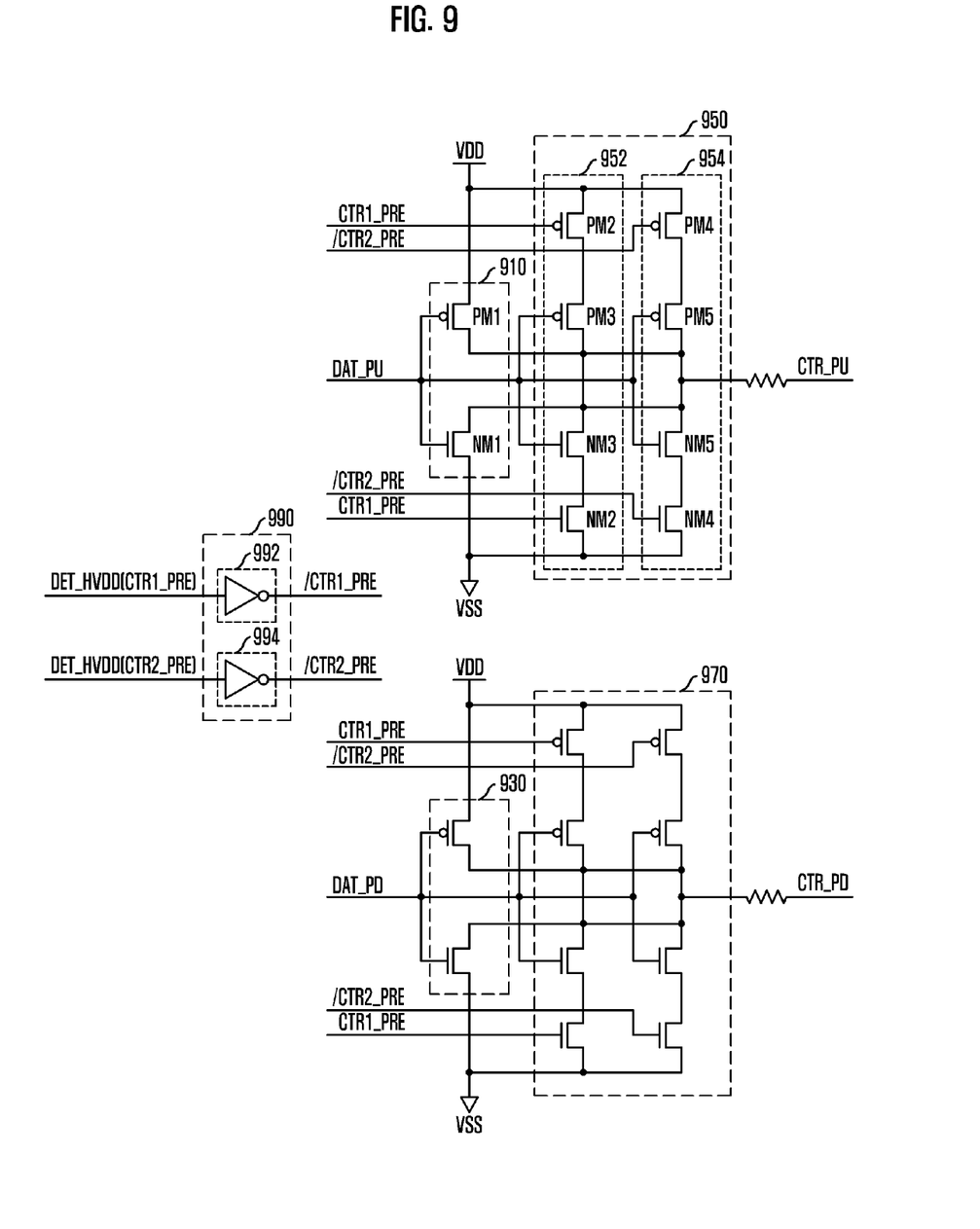
FIG. 9 is a circuit diagram illustrating the pre-drive unit in the data output driver 550 shown in FIG. 5.

FIG. 9 is a detailed circuit diagram illustrating the pre-drive unit in the data output driver 550 shown in FIG. 5. For reference, the data output driver 550 includes the pre-drive unit and the main drive unit, wherein the main drive unit will be described in detail below with reference to FIG. 10.

Referring to FIG. 9, the pre-drive unit is provided with a pull-up pre-driver 910, a pull-down pre-driver 930, a pull-up pre-drive current controller 950, a pull-down pre-drive current controller 970, and a pre-control signal generator 990.

The pull-up pre-driver 910 serves to generate a pull-up drive control signal CTR_PU in response to a pull-up data signal DAT_PU, and is provided with a first PMOS transistor PM1 and a first NMOS transistor NM1 whose source-drain path is established between an external power supply voltage VDD terminal and a ground voltage VSS terminal and whose gates receive the pull-up data signal DAT_PU. Further, the pull-down pre-driver 930 serves to generate a pull-down drive control signal CTR_PD in response to the pull-down data signal DAT_PD. The circuit configuration thereof is similar to that of the pull-up pre-driver 910, except that it receives the pull-down data signal DAT_PD instead of the pull-up data signal DAT_UP inputted to the pull-up pre-driver 910 and outputs the pull-down drive control signal CTR_PD instead of the pull-up drive control signal CTR_PU. Thus, a detailed description thereon will be omitted here.

The pull-up pre-drive current controller 950 generates a pull-up drive control signal CTR_PU in response to the first and the second pre-control signals CTR1_PRE, /CTR1_PRE and CTR2_PRE, /CTR2_PRE, and the pull-up data signal DAT_PU, and it may be provided with a first pull-up pre-drive current controller 952 and a second pull-up pre-drive current controller 954.

The first pull-up pre-drive current controller 952 is provided with the second and third PMOS transistors PM2 and PM3 whose source-drain path is formed between the external power supply voltage VDD terminal and the pull-up drive control signal CTR_PU output terminal (here, a resistor passing through the pull-up drive control signal CTR_PU is omitted for convenience of explanation) and whose gates take the first positive pre-control signal CTR1_PRE and the pull-up data signal DAT_PU respectively, and second and third NMOS transistors NM2 and NM3 whose source-drain path is arranged between the pull-up drive control signal CTR_PU output terminal and the ground voltage VSS terminal and whose gates receive the first negative pre-control signal /CTR1_PRE and the pull-up data signal DAT_PU, respectively. Here, details of the first positive/negative pre-control signals CTR1_PRE and /CTR1_PRE will be given, when describing the pre-control signal generator 990 later.

The second pull-up pre-drive current controller 954 is provided with fourth and fifth PMOS transistors PM4 and PM5 whose source-drain path is established between the external power supply voltage VDD terminal and the ground voltage VSS terminal and whose gates take the second negative pre-control signal /CTR2_PRE and the pull-up data signal DAT_PU respectively, and fourth and fifth NMOS transistors NM4 and NM5 whose gates receive the second positive pre-control signal CTR2_PRE and the pull-down data signal DAT_PD, respectively. Here, details of the second positive/negative pre-control signals CTR2_PRE and /CTR2_PRE will be given, when describing the pre-control signal generator 990 later.

The pull-down pre-drive current controller 970 serves to generate the pull-down drive control signal CTR_PD in response to the first and the second pre-control signals CTR1_PRE, /CTR1_PRE and CTR2_PRE, /CTR2_PRE, and the pull-down data signal DAT_PD. Since the circuit configuration thereof is similar to the pull-up pre-drive current controller 950, except that it receives the pull-down data signal DAT_PD instead of the pull-up data signal DAT_UP inputted to the pull-up pre-drive current controller 950 and outputs the pull-down drive control signal CTR_PD instead of the pull-up drive control signal CTR_PU. Thus, a detailed description thereon will be omitted here.

Here, since the pull-up pre-drive current controller 950 and the pull-down pre-drive current controller 970 receive the pull-up data signal DAT_PU and the pull-down data signal DAT_PD respectively, the pull-up pre-drive current controller 950 operates during an interval when the pull-up pre-driver 910 is activated, and the pull-down pre-drive current controller 970 operates during an interval when the pull-down pre-driver 930 is activated.

Meanwhile, the pre-control signal generator 990 is for generating the first negative pre-control signal /CTR1_PRE and the second negative pre-control signal CTR1_PRE in response to the first and the second detection signals DET_H-VDD and DET_LVDD, and is provided with first and second pre-control signal generators 992 and 994. Here, the first detection signal DET_HVDD may be the first positive pre-control signal CTR1_PRE as noted above and the second detection signal DET_LVDD may be the second positive pre-control signal CTR2_PRE. Also, the first negative pre-control signal /CTR1_PRE may be an inverted signal of the first positive pre-control signal CTR1_PRE and the second negative pre-control signal /CTR2_PRE may be an inverted signal of the second positive pre-control signal CTR2_PRE.

Hereinafter, the operation of the pre-drive unit will simply be described. For convenience of explanation, the pull-up pre-driver 950 will be described representatively, with reference to FIGS. 7 and 9.

As shown in FIG. 7, in case of the first interval ①, that is, in the case where the semiconductor memory device receives a lower external power supply voltage VDD than the target voltage level, the first positive pre-control signal CTR1_PRE becomes logic 'low', and the second positive pre-control signal CTR2_PRE becomes logic 'high'. Also, the first negative pre-control signal /CTR1_PRE becomes logic 'high', and the second negative pre-control signal /CTR2_PRE becomes logic 'low'. Because of this, the second PMOS transistor PM2 and the second NMOS transistor NM2 of the first pull-up pre-drive current controller 952 are turned on, and the fourth PMOS transistor PM4 and the fourth NMOS transistor NM4 of the second pull-up pre-drive current controller 954 are turned on. At this time, when the pull-up data signal DAT_PU is applied, the pull-up pre-driver 910 and the first and the second pull-up pre-drive current controllers 952 and 954 are activated, so that the pull-up drive control signal CTR_PU can generate a corresponding drive current.

In case of the second interval ②, that is, in the case where the semiconductor memory device receives an external power supply voltage VDD equivalent to the target voltage level, the second PMOS transistor PM2 and the second NMOS transistor NM2 of the first pull-up pre-drive current controller 952 are turned on, and the fourth PMOS transistor PM4 and the fourth NMOS transistor NM4 of the second pull-up pre-drive current controller 954 are turned off. In result, the pull-up drive control signal CTR_PU can cause the generation of a drive current corresponding to the pull-up pre-driver 910 and the first pull-up pre-drive current controller 952.

In the third case ③, that is, in the case where the semiconductor memory device receives a higher external power supply voltage VDD than the target voltage level, since the first and the second pull-up pre-drive current controllers 952 and 954 are all inactivated, the pull-up drive control signal CTR_PU can cause the generation of a drive current corresponding to the pull-up pre-driver 910.

The pre-drive unit of the present invention can control a drive current depending on a voltage level of the external power supply voltage VDD, and thus, the pull-up drive control signal CTR_PU and the pull-down drive control signal CTR_PD can always have the same characteristics. That is, typically, the cases as shown in (A) to (C) of FIG. 3 occurred depending on a change in a voltage level of the external power supply voltage VDD. However, in accordance with the present invention, since the drive current of the pre-drive unit is controlled by the external power supply voltage, the main drive unit, whose on/off time point is determined in response to the pull-up drive control signal CTR_PU and the pull-down drive control signal CTR_PD, can generate an output data signal DOUT with characteristics as shown in (A) of FIG. 3.

Figure 10:
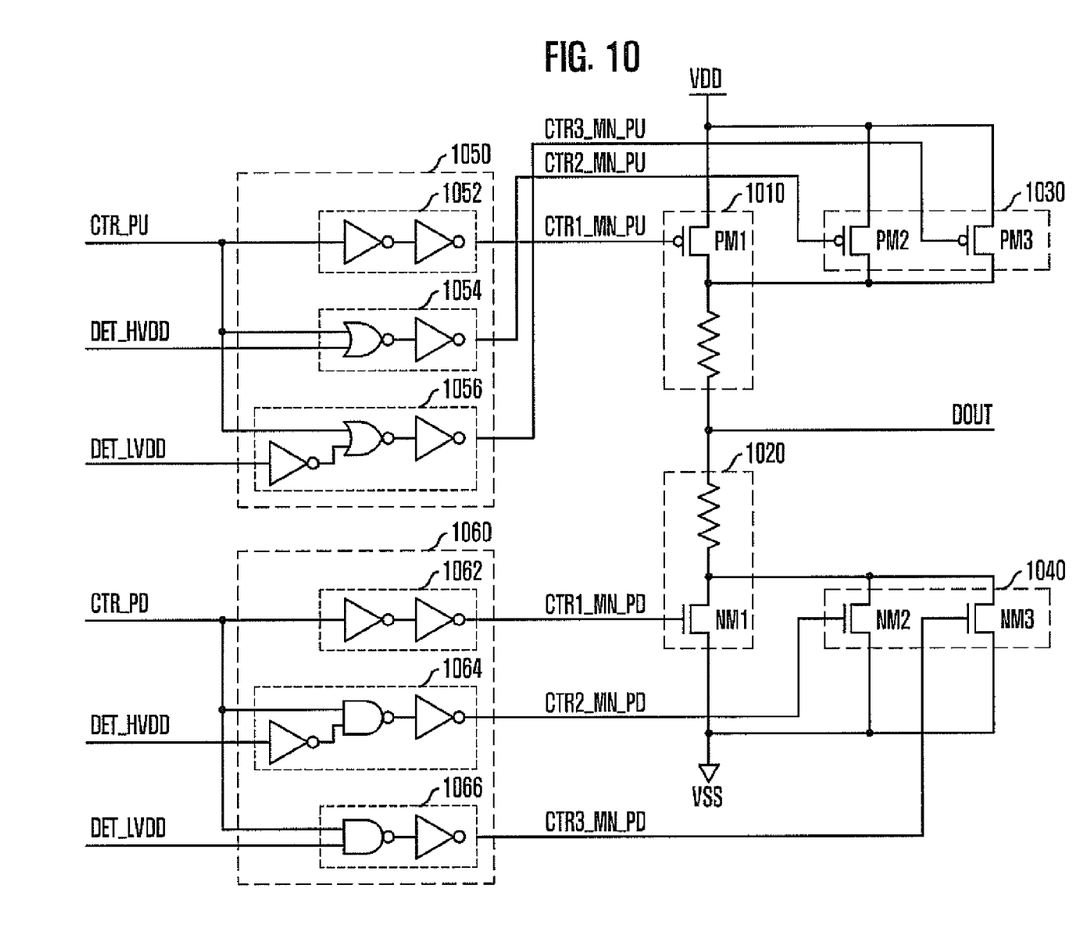
FIG. 10 is a circuit diagram illustrating the main drive unit in the data output driver 550 shown in FIG. 5.

FIG. 10 is a detailed circuit diagram illustrating the main drive unit in the data output driver 550 shown in FIG. 5.

Referring to FIG. 10, the min drive unit is provided with a pull-up main driver 1010, a pull-down main driver 1020, a pull-up main drive current controller 1030, a pull-down main drive current controller 1040, a pull-up main control signal generator 1050, and a pull-down main control signal generator 1060.

The pull-up main driver 1010 is for driving an output terminal outputting an output data signal DOUT in response to a pull-up drive control signal CTR_PU, and is provided with a first PMOS transistor PM1 whose source-drain path is established between the external power supply voltage VDD terminal and the output terminal and whose gate receives a first pull-up main control signal CTR1_MN_PU, wherein a resistor coupled between the first PMOS transistor PM1 and the output terminal is omitted for convenience of explanation.

The pull-down main driver 1020 is for driving the output terminal outputting the output data signal DOUT in response to a pull-down drive control signal CTR_PD, and is provided with a first NMOS transistor NM1 whose source-drain path is arranged between the output terminal and the ground voltage VSS terminal and whose gate takes a first pull-down main control signal CTR1_MN_PD.

The pull-up main driver 1030 is for driving the output terminal outputting the output data signal DOUT in response to second and third pull-up main control signals CTR2_MN_PU and CTR3_MN_PU, and is provided with second and third PMOS transistor PM2 and PM3 whose source-drain path is established between the external power supply voltage VDD terminal and the output terminal and whose gates receives a second pull-up main control signal CTR2_MN_PU, and a third pull-up main control signal CTR3_MN_PU, respectively.

The pull-down main driver 1040 is for driving the output terminal outputting the output data signal DOUT in response to the second and the third pull-down main control signals CTR2_MN_PD and CTR3_MN_PD, and is provided with second and third NMOS transistor NM2 and NM3 whose source-drain path is established between the output terminal and the ground voltage VSS terminal and whose gates receives second and third pull-down main control signal CTR2_MN_PD and CTR3_MN_PD.

The pull-up main control signal generator 1050 serves to generate the first to third pull-up main control signals CTR1_MN_PU, CTR2_MN_PU and CTR3_MN_PU in response to the pull-up drive control signal CTR_PU and the first and the second detection signals DET_HVDD and DET_LVDD, and is provided with first to third pull-up main control signal generators 1052, 1054, and 1056.

The first pull-up main control signal generator 1052 can produce the first pull-up main control signal CTR1_MN_PU in response to the pull-up drive control signal CTR_PU, the second pull-up main control signal generator 1054 can generate the second pull-up main control signal CTR2_MN_PU in response to the pull-up drive control signal CTR_PU and the first detection signal DET_HVDD, and the third pull-up main control signal generator 1056 can generate the third pull-up main control signal CTR3_MN_PU in response to the pull-up drive control signal CTR_PU and the second detection signal DET_LVDD.

First, the operation of the pull-up main control signal generator 1050 will simply be described. In response to the pull-up drive control signal CTR_PU, the first pull-up main control signal CTR1_MN_PU is activated. When the first detection signal DET is activated, the second pull-up main control signal CTR2_MN_PU is activated in response to the pull-up drive control signal CTR_PU. And when the second detection signal DET_LVDD is activated, the third pull-up main control signal CTR3_MN_PU is activated in response to the pull-up drive control signal CTR_PU. That is, the pull-up main control signal generator 1050 can activate the first to third main control signals CTR1_MN_PU, CTR2_MN_PU, and CTR3_MN_PU during an interval when the pull-up main driver 1010 is activated in response to the pull-up drive control signal CTR_PU.

Meanwhile, when comparing with the pull-up main control signal generator 1050, the pull-down main control signal generator 1060 receives the pull-down drive control signal CTR_PD instead of the pull-up drive control signal CTR_PU, and outputs the first to third pull-down main control signals CTR1_MN_PD, CTR2_MN_PD and CTR3_MN_PD instead of the first to third pull-up main control signals CTR1_MN_PU, CTR2_MN_PU and CTR3_MN_PU. Therefore, a detailed description of the circuit configuration and operation thereof will be omitted here.

Hereinafter, a simple circuit operation of the main drive unit will be described with reference to FIGS. 7 to 10. For convenience of explanation, reference will be made to a case where the pull-up drive control signal CTR_PU is activated to logic 'low'. For information, since the pull-down drive control signal CTR_PD becomes logic 'low' at that time, the first to third pull-down main control signals CTR1_MN_PD, CTR2_MN_PD and CTR3_MN_PD will all be inactivated to logic 'low'.

As shown in FIG. 7, in case of the first interval ①, that is, in the case where the semiconductor memory device receives a lower external power supply voltage VDD than the target voltage level, the first pull-up main control signal CTR1_MN_PU becomes logic 'low' in response to the pull-up drive control signal CTR_PU. At this time, the second and the third pull-up main control signals CTR2_MN_PD and CTR3_MN_PD become logic 'low'. That is, the first PMOS transistor PM1 of the pull-up main driver 1010 and the second and the third PMOS transistors PM2 and PM3 of the pull-up main drive current controller 1030 are turned on. Thus, the output terminal outputting the output data signal DOUT can have a drive current corresponding to the first to third PMOS transistors PM1, PM2, and PM3.

In case of the second interval ②, that is, in the case where the semiconductor memory device receives the external power supply voltage VDD equivalent to the target voltage level, the first PMOS transistor PM1 of the pull-up main driver 1010 and the second PMOS transistor PM2 of the pull-up main drive current controller 1030 are turned on, and the third PMOS transistor PM3 is turned off. As a result, the output terminal outputting the output data signal DOUT can have a drive current corresponding to the first and the second PMOS transistors PM1 and PM2.

In case of the third interval ③, that is, in the case where the semiconductor memory device receives a higher external power supply voltage VDD than the target voltage level, since the pull-up main drive current controller 1030 is inactivated, the output terminal outputting the output data signal DOUT can have a drive current corresponding to the first PMOS transistor PM1.

Figure 11A:
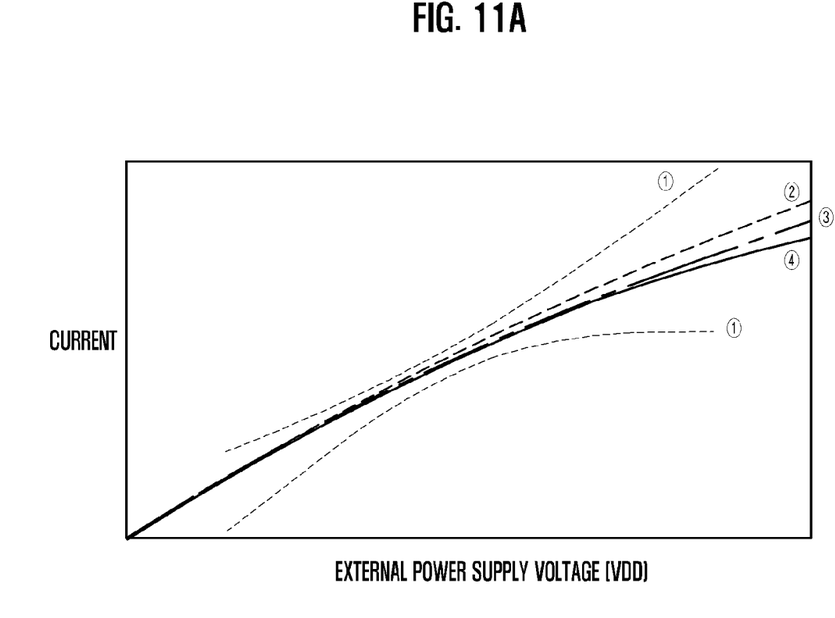
FIGS. 11A and 11B are views showing current characteristics in terms of the external power supply voltage VDD of the main drive unit in FIG. 10.
Figure 11B:
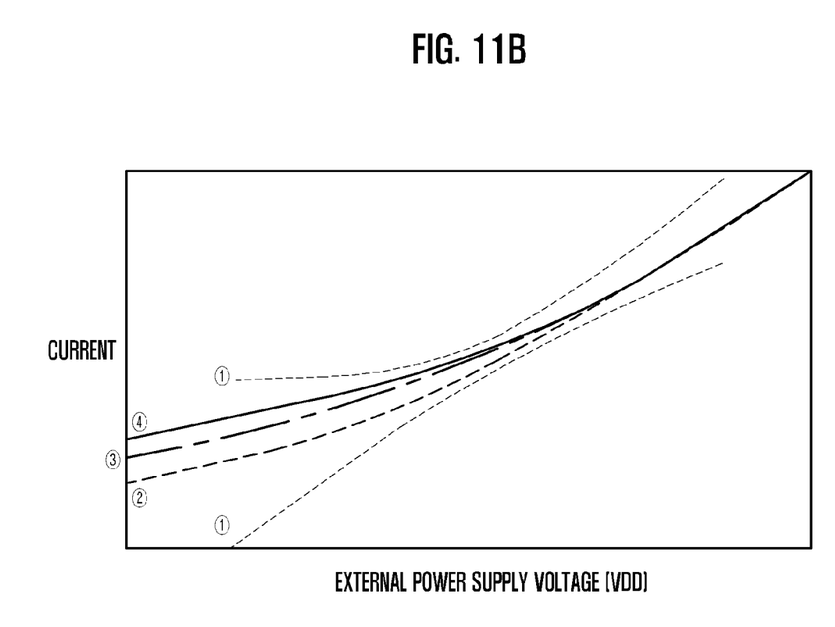

FIGS. 11A and 11B are views for explaining current characteristics in terms of an external power supply voltage VDD of the main drive unit in FIG. 10. FIG. 11A shows characteristics of current flowing through the output terminal of the output data signal DOUT during the pull-down operation and FIG. 11B shows characteristics of current flowing through the output terminal of the output data signal DOUT during the pull-up operation. In the drawings, ① indicate the upper limit and the lower limit of consumption current defined in the spec, ② shows a case where the external power supply voltage VDD is higher than the target voltage level, ③ shows a case where the external power supply voltage VDD has the target voltage level, and ④ shows a case where the external power supply voltage VDD is lower than the target voltage level.

As can be seen from FIGS. 11A and 11B, the current characteristics of the main drive unit can meet the spec although a voltage level of the external power supply voltage varies. That is, since the main drive unit of the present invention can control a drive current based on a voltage level of the external power supply voltage VDD, the current flowing through the output terminal outputting the output data signal DOUT can always have characteristics that meet the spec.

As mentioned above, the semiconductor memory device in accordance with the present invention can adjust drive currents of the data input driver 530 (see FIG. 5) and the data output driver 550 depending on a voltage level of the external power supply voltage VDD. That is to say, if a voltage level of the external power supply voltage VDD is higher than the target voltage level, the semiconductor memory device adjusts a drive current so that it has a less amount of current than that corresponding to the external power supply voltage VDD being applied. And if a voltage level of the external power supply voltage VDD is lower than the target voltage level, it adjusts a drive current so that it has a more amount of current than that corresponding to the external power supply voltage VDD being applied. As a result, even if there is a variation in a voltage level of the external power supply voltage VDD, the semiconductor memory device can always be controlled by the same drive current.

Therefore, it is possible to perform input/output operations with constant characteristics at all times although there is a variation in a voltage level of the external power supply voltage VDD. This can make it possible to ensure sufficient reliability of data exchange operations between a CPU and the semiconductor memory device. In addition, the semiconductor memory device, in accordance with the present invention, can always execute operations meeting the spec, which provides high mass-production and compatibility.

Moreover, while the above embodiments have been described by way of example, with respect to a case where it is determined whether an external power supply voltage VDD is higher or lower than a target voltage level by using the first and the second detection signals DET_HVDD and DET_LVDD with digital characteristics to control a drive current based on the determination, the present invention may be applied to a case of controlling a drive current by using detection signals with analog characteristics corresponding to a voltage level of the external power supply voltage VDD, instead of the first and the second detection signals DET_HVDD and DET_LVDD. In this case, it is preferable to have a configuration in which a drive current is adjusted based on detection signals with analog characteristics, when controlling the drive current of the data input/output drivers.

Furthermore, it should be noted that the logic gates and transistors used in the embodiments mentioned above may be arranged in different positions and implemented in different types based on polarities of input signals.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device for receiving an external power supply voltage, comprising:
   a data input driver configured to receive the external power supply voltage and to input data, wherein the data input driver is further configured to be driven by an input drive current;
   a data output driver configured to receive the external power supply voltage and to output data, wherein the data output driver is further configured to be driven by an output drive current; and
   a voltage detector configured to detect the external power supply voltage, and to generate a detection signal,
   wherein the input drive current and the output drive current are controlled by the detection signal, and
   wherein the voltage detector includes:
      a divider configured to divide the external power supply voltage and output the divided external power supply voltage as an internal reference voltage;
      a comparator configured to compare the internal reference voltage with an external reference voltage; and
      an output portion configured to output the detection signal from the comparator.

2. The semiconductor memory device as recited in claim 1, wherein the input data driver includes
   an input portion receiving input data and the input drive current; and
   an input drive current controller configured to control the input drive current based on the detection signal.

3. The semiconductor memory device recited in claim 2, further comprising a buffer configured to buffer an output signal from the input portion, and to output a buffered signal as internal data.

4. The semiconductor memory device as recited in claim 2, further comprising an input control signal generator configured to generate an input control signal to control the input drive current controller based on the detection signal.

5. The semiconductor memory device as recited in claim 4, wherein the input control signal generator activates the input control signal during an input portion activation interval.

6. The semiconductor memory device as recited in claim 1, wherein the data output driver includes:
   a pre-drive unit configured to control a pre-drive current based on data to be outputted and the detection signal, and to generate a drive control signal based on the pre-drive current; and
   a main drive unit configured to control a main drive current in response to the drive control signal and the detection signal, and to drive its output terminal based on the main drive current.

7. The semiconductor memory device as recited in claim 6, wherein the pre-drive unit includes:
   a pre-driver configured to generate the drive control signal based on the data to be outputted; and
   a pre-drive current controller configured to control the pre-drive current based on data to be outputted and the detection signal.

8. The semiconductor memory device as recited in claim 7, further comprising a pre-control signal generator configured to generate a pre-control signal to control the pre-drive current controller based on the detection signal.

9. The semiconductor memory device as recited in claim 7, wherein the pre-drive current controller operates during a pre-driver activation interval.

10. The semiconductor memory device as recited in claim 6, wherein the main drive unit includes:
    a main driver configured to drive the output terminal based on the drive control signal; and
    a main drive current controller configured to drive the main drive current based on the drive control signal and the detection signal.

11. The semiconductor memory device as recited in claim 10, further comprising a main control signal generator configured to generate a main control signal to control the main drive current controller based on the drive control signal and the detection signal.

12. The semiconductor memory device as recited in claim 11, wherein the main control signal generator activates the main control signal during a main driver activation interval.

13. A read drive circuit for use in a semiconductor memory device, the read drive circuit comprising:
    a pre-drive unit configured to generate a drive control signal corresponding to internal data;
    a main drive unit configured to provide output data corresponding to the internal data to a main drive output terminal based on the drive control signal; and
    a voltage detector configured to detect an external power supply voltage and to generate a detection signal, wherein the detection signal controls a pre-drive current of the pre-drive unit and a main drive current of the main drive unit, wherein the voltage detector includes:
 a divider configured to divide the external power supply voltage and output the divided external power supply voltage as an internal reference voltage;
 a comparator configured to compare the internal reference voltage with an external reference voltage; and
 an output portion configured to output the detection signal from the comparator.

14. The read drive circuit as recited in claim 13, wherein each of the pre-drive unit and the main drive unit receives the external power supply voltage.

15. The read drive circuit as recited in claim 13, wherein the pre-drive unit includes:
 a pre-driver configured to generate the drive control signal based on the internal data; and
 a pre-drive current controller configured to control the pre-drive current based on the internal data and the detection signal.

16. The read drive circuit as recited in claim 15, further comprising a pre-control signal generator configured to generate a pre-control signal to control the pre-drive current controller in response to the detection signal.

17. The read drive circuit as recited in claim 15, wherein the pre-drive current controller operates during a pre-driver activation interval.

18. The read drive circuit as recited in claim 13, wherein the main drive unit includes:

a main driver configured to drive the main drive output terminal in response to the drive control signal; and
 a main current controller configured to control the main drive current based on the drive control signal and the detection signal.

19. The read drive circuit as recited in claim 18, further comprising a main control signal generator configured to generate a main control signal to control the main current controller based on the drive control signal and the detection signal.

20. The read drive circuit as recited in claim 19, wherein the control signal generator activates the control signal during a main driver activation interval.

21. A driving method of a semiconductor memory device, comprising:
 detecting a voltage level of an external power supply voltage and generating a detection result;
 performing data input/output operations with a lower drive current than a first drive current if the external power supply voltage is determined to be higher than a target voltage level based on the detection result; and
 performing data input/output operations with a higher drive current than the first drive current if the external power supply voltage is determined to be lower than the target voltage level based on the detection result,
 wherein the detecting of the voltage level of the external power supply voltage includes comparing an external reference voltage with an internal reference voltage indicating the target voltage level of the external power supply voltage.

* * * * *